United States Patent
Seo et al.

(10) Patent No.: US 8,350,258 B2
(45) Date of Patent: Jan. 8, 2013

(54) METHOD OF MANUFACTURING AN ORGANIC LIGHT EMITTING DIODE DISPLAY

(75) Inventors: Jeongdae Seo, Incheon (KR); Jeongwon Lee, Mungyeong-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/913,002

(22) Filed: Oct. 27, 2010

(65) Prior Publication Data
US 2011/0108811 A1 May 12, 2011

(30) Foreign Application Priority Data

Nov. 6, 2009 (KR) .................. 10-2009-0107042

(51) Int. Cl.
*H01L 29/08* (2006.01)
(52) U.S. Cl. .................................................. 257/40
(58) Field of Classification Search .............. 257/40
See application file for complete search history.

(56) References Cited

U.S. PATENT DOCUMENTS

| 5,126,214 | A * | 6/1992 | Tokailin et al. ............ 428/690 |
| 6,919,215 | B2 * | 7/2005 | Yamazaki et al. ............ 438/21 |
| 2009/0295274 | A1 * | 12/2009 | Hwang et al. ............ 313/504 |
| 2009/0309070 | A1 * | 12/2009 | Ogata et al. ............ 252/500 |

FOREIGN PATENT DOCUMENTS

CN    1764335 A    4/2006

OTHER PUBLICATIONS

Office Action issued in corresponding Chinese Patent Application No. 201010539018.0, mailed Jul. 27, 2012.

* cited by examiner

*Primary Examiner* — David Vu
*Assistant Examiner* — Caleb Henry
(74) *Attorney, Agent, or Firm* — Brinks Hofer Gilson & Lione

(57) ABSTRACT

An organic light emitting diode display and a method of manufacturing the same are disclosed. The organic light emitting diode display includes a first substrate, an organic light emitting diode that is positioned on the first substrate and includes a first electrode, an organic layer having at least a light emitting layer, and a second electrode, an organic buffer layer that is positioned on an entire surface of the organic light emitting diode and has a hydroxy group or an amide group, a sealant positioned on an entire surface of the organic buffer layer, and a second substrate positioned on the sealant.

2 Claims, 3 Drawing Sheets

METHOD OF MANUFACTURING AN ORGANIC LIGHT EMITTING DIODE DISPLAY

This application claims the benefit of Korea Patent Application No. 10-2009-0107042, filed on Nov. 6, 2009, the entire contents of which is incorporated herein by reference for all purposes as if fully set forth herein.

BACKGROUND

1. Field of the Invention

Exemplary embodiments of the disclosure relate to an organic light emitting diode display and a method of manufacturing the same, and more particularly, to an organic light emitting diode display and a method of manufacturing the same capable of preventing the penetration of moisture and oxygen from the outside.

2. Discussion of the Related Art

The importance of flat panel displays has recently increased with the growth of multimedia. Various flat panel displays such as liquid crystal displays (LCDs), plasma display panels (PDPs), field emission displays (FEDs), and organic light emitting diode (OLED) displays have been put to practical use.

In particular, the OLED display has a high response speed (of 1 ms or less), low power consumption, and a self-emitting structure. The OLED display has a wide viewing angle and thus can used as a motion picture display regardless of the size of the OLED display. Further, because the OLED display can be manufactured at a low temperature using a simple manufacturing process based on an existing semiconductor process technology, the OLED display has been considered as a next generation display.

In the related art, the OLED display was manufactured by forming an organic light emitting diode including a first electrode on a first substrate, an organic layer, and a second electrode, applying a sealant to an edge of a second substrate formed of glass or metal, and attaching the second substrate to the first substrate.

However, because a space exists between the organic light emitting diode and the second substrate, a middle portion of the second substrate is damaged by an external impact. Further, it is difficult to prevent the penetration of moisture and oxygen from the outside using only the sealant.

BRIEF SUMMARY

Exemplary embodiments of the invention provide an organic light emitting diode display and a method of manufacturing the same capable of preventing a damage of the organic light emitting diode display and preventing the penetration of moisture and oxygen from the outside.

In one aspect, there is an organic light emitting diode display comprising a first substrate, an organic light emitting diode positioned on the first substrate, the organic light emitting diode including a first electrode, an organic layer having at least a light emitting layer, and a second electrode, an organic buffer layer positioned on an entire surface of the organic light emitting diode, the organic buffer layer having a hydroxy group or an amide group, a sealant positioned on an entire surface of the organic buffer layer, and a second substrate positioned on the sealant.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE DRAWINGS AND THE PRESENTLY PREFERRED EMBODIMENTS

Reference will now be made in detail embodiments of the invention examples of which are illustrated in the accompanying drawings. In the present invention, a term of "group" can comprise meanings of "a functional group or a radical".

An organic light emitting diode display according to an exemplary embodiment of the invention may include a first substrate, an organic light emitting diode that is positioned on the first substrate and includes a first electrode, an organic layer having at least a light emitting layer, and a second electrode, an organic buffer layer that is positioned on an entire surface of the organic light emitting diode and has a hydroxy group or an amide group, a sealant positioned on an entire surface of the organic buffer layer, and a second substrate positioned on the sealant.

The organic buffer layer may be formed of a compound represented by the following chemical formula 1:

[Chemical Formula 1]

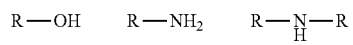

where R is an aromatic compound or an aliphatic compound including carbon (C), nitrogen (N), oxygen (O), and sulfur (S).

The compound represented by the chemical formula 1 may be one selected among the following compounds.

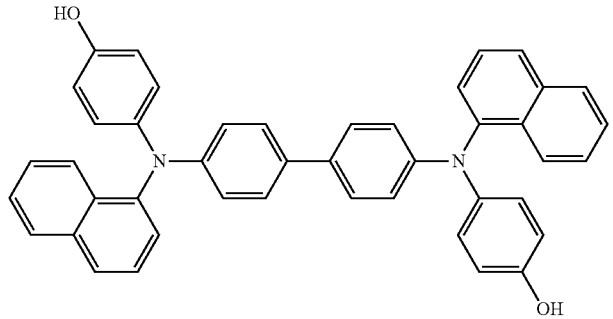

-continued

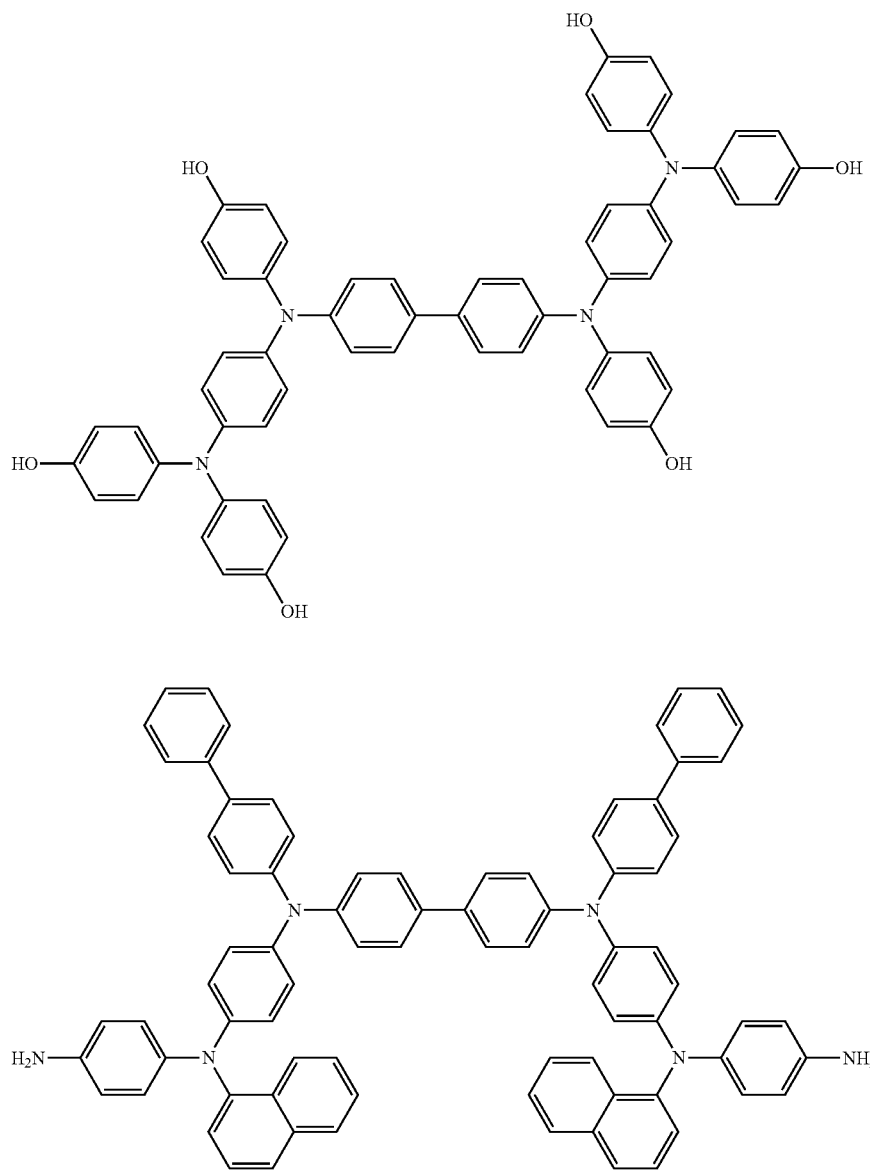

The compound may have a molecular weight of 200 Mw to 5,000 Mw.

The sealant may be an epoxy-based material.

The organic layer may further include at least one of a hole injection layer, a hole transport layer, an electron transport layer, and an electron injection layer.

A method of manufacturing an organic light emitting diode display according to an exemplary embodiment of the invention may include forming an organic light emitting diode including a first electrode, an organic layer having at least a light emitting layer, and a second electrode on a first substrate, forming an organic buffer layer having a hydroxy group or an amide group on an entire surface of the organic light emitting diode, forming a sealant on an entire surface of the organic buffer layer, and attaching a second substrate opposite the first substrate to the first substrate.

The organic buffer layer may be formed of a compound represented by the following chemical formula 1:

[Chemical Formula 1]

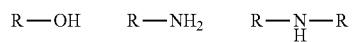

where R is an aromatic compound or an aliphatic compound including carbon (C), nitrogen (N), oxygen (O), and sulfur (S).

The compound represented by the chemical formula 1 may be one selected among the following compounds.

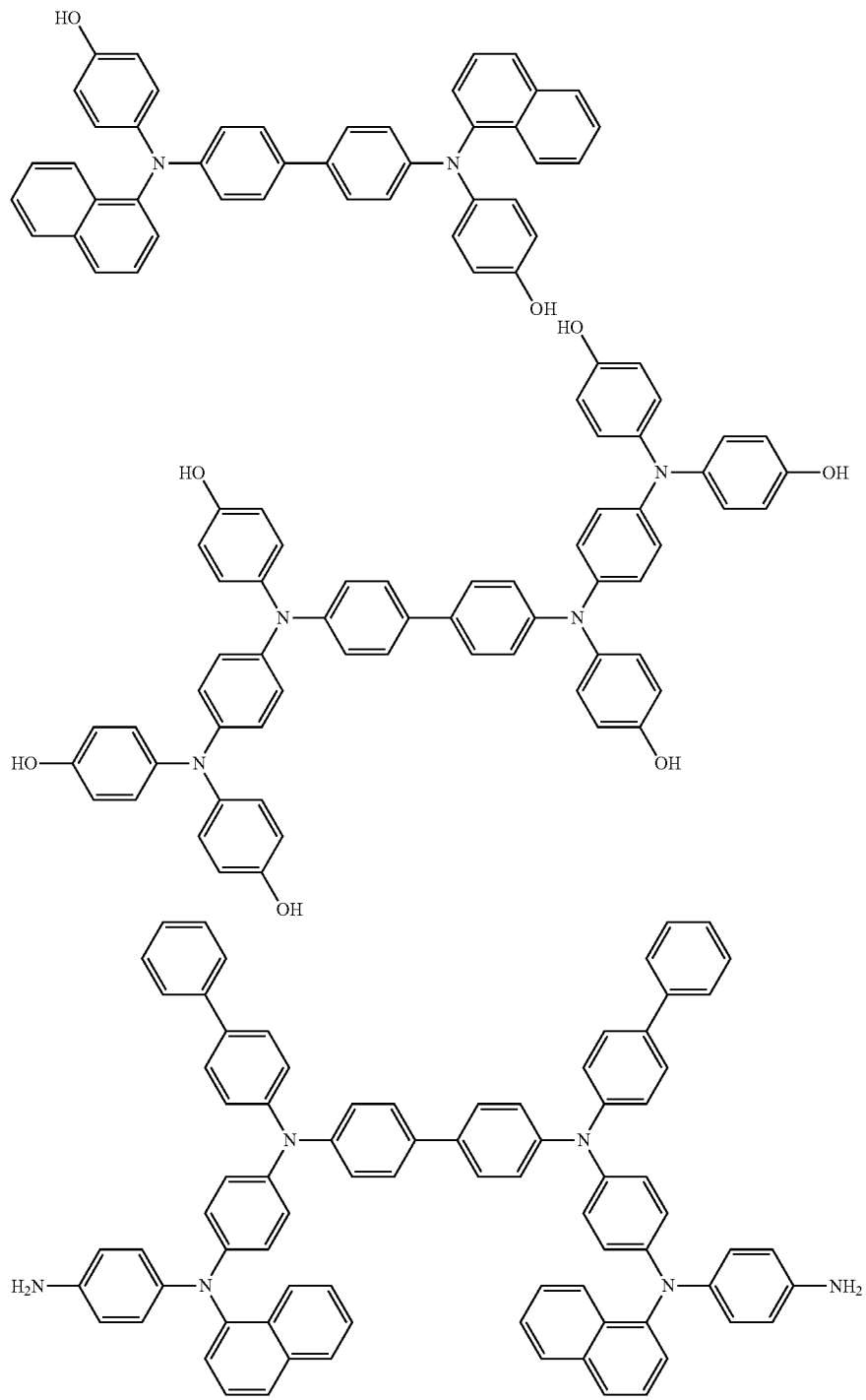

After forming the sealant, the sealant may be cured.

Reference will now be made in detail embodiments of the invention examples of which are illustrated in the accompanying drawings.

Figure 1:
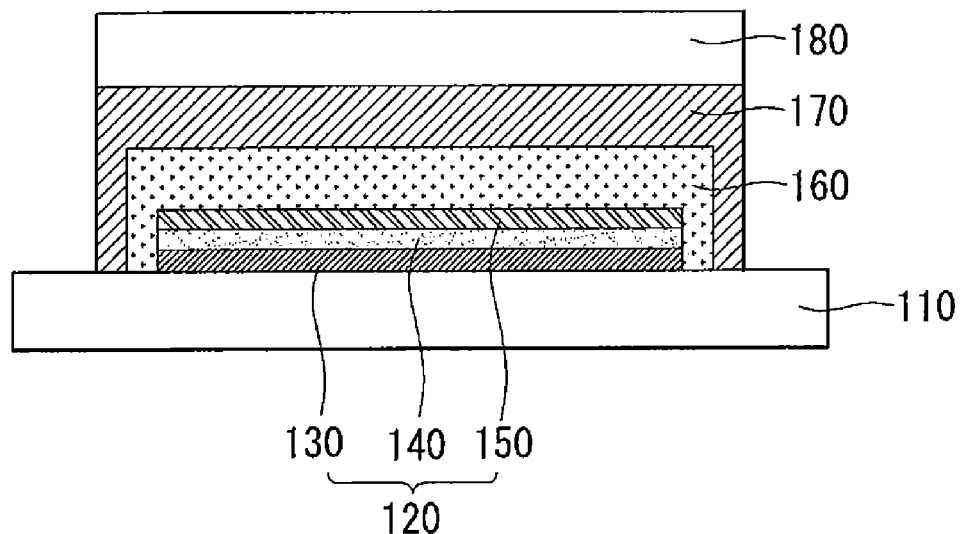
FIG. 1 illustrates an organic light emitting diode display according to an exemplary embodiment of the invention.
Figure 2:
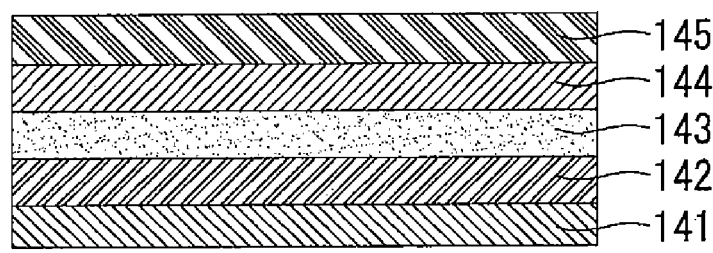
FIG. 2 illustrates an organic layer of an organic light emitting diode display according to an exemplary embodiment of the invention.

FIG. 1 illustrates an organic light emitting diode (OLED) display according to an exemplary embodiment of the invention. FIG. 2 illustrates an organic layer of the OLED display shown in FIG. 1.

As shown in FIG. 1, an OLED display 100 according to an exemplary embodiment of the invention includes a first substrate 110, an organic light emitting diode 120, an organic buffer layer 160 that is positioned on the entire surface of the organic light emitting diode 120 and has a hydroxy group or an amide group, a sealant 170 positioned on the entire surface of the organic buffer layer 160, and a second substrate 180 positioned on the sealant 170. The organic light emitting diode 120 includes a first electrode 130 positioned on the first substrate 110, an organic layer 140 including at least a light emitting layer, and a second electrode 150.

The first substrate 110 may use a transparent substrate formed of glass, plastic, or a conductive material. The OLED display 100 may include a buffer layer (not shown) on the first substrate 110. The buffer layer protects the organic light emitting diode 120 to be formed in a subsequent process from impurities, for example, alkali ions discharged from the first substrate 110. The buffer layer may be formed using silicon dioxide ($SiO_2$), silicon nitride (SiNX), or other materials.

The organic light emitting diode 120 including the first electrode 130, the organic layer 140, and the second electrode 150 is positioned on the first substrate 110.

The first electrode 130 may be an anode electrode, a transparent electrode, or a reflection electrode. When the first electrode 130 is the transparent electrode, the first electrode 130 may be formed of one of indium-tin-oxide (ITO), indium-zinc-oxide (IZO), and zinc oxide (ZnO). When the first electrode 130 is the reflection electrode, the first electrode 130 may include a layer formed of one of ITO, IZO and ZnO and a reflective layer formed of one of aluminum (Al), silver (Ag) or nickel (Ni) positioned under the layer. Further, the first electrode 130 serving as the reflection electrode may include the reflective layer between two layers formed of one of ITO, IZO and ZnO.

The first electrode 130 may be formed using a sputtering method, an evaporation method, a vapor phase deposition method, or an electron beam deposition method.

The organic layer 140 is formed on the first substrate 110 on which the first electrode 130 is formed. The organic layer 140 includes at least a light emitting layer 143 and may further include a hole injection layer 141, a hole transport layer 142, an electron transport layer 144, and an electron injection layer 145 positioned on or under the light emitting layer.

More specifically, as shown in FIG. 2, the hole injection layer 141 may allow holes from the first electrode 130 to be smoothly injected into the light emitting layer 143. The hole injection layer 141 may be formed of at least one selected from the group consisting of copper phthalocyanine (CuPc), PEDOT (poly(3,4)-ethylenedioxythiophene), polyaniline (PANI), and NPD (N,N-dinaphthyl-N,N'-diphenyl benzidine). Other materials may be used.

The hole injection layer 141 may be formed using an evaporation method or a spin coating method. The hole injection layer 141 may have a thickness of 5 nm to 150 nm.

The hole transport layer 142 may smoothly perform the transport of holes. The hole transport layer 142 may be formed of at least one selected from the group consisting of NPD (N,N-dinaphthyl-N,N'-diphenyl benzidine), TPD (N,N'-bis-(3-methylphenyl)-N,N'-bis-(phenyl)-benzidine, s-TAD, and MTDATA (4,4',4"-Tris(N-3-methylphenyl-N-phenyl-amino)-triphenylamine). Also, other materials may be used.

The hole transport layer 142 may be formed using the evaporation method or the spin coating method. The hole transport layer 142 may have a thickness of 5 nm to 150 nm.

The light emitting layer 143 may be formed of a material capable of emitting red, green, and blue light and may be formed of a phosphorescence material or a fluorescence material.

When the light emitting layer 143 emits red light, the light emitting layer 143 includes a host material containing carbazole biphenyl (CBP) or N,N-dicarbazolyl-3,5-benzene (mCP). Further, the light emitting layer 143 may be formed of a phosphorescence material including a dopant containing at least one selected from the group consisting of PlQIr (acac) (bis(1-phenylisoquinoline)acetylacetonate iridium), PQIr (acac)(bis(1-phenylquinoline)acetylacetonate iridium), PQIr (tris(1-phenylquinoline)iridium) and PtOEP (octaethylporphyrin platinum) or a fluorescence material containing PBD: Eu $(DBM)_3$(Phen) or Perylene. Other materials may be used.

When the light emitting layer 143 emits green light, the light emitting layer 143 includes a host material containing CBP or mCP. Further, the light emitting layer 143 may be formed of a phosphorescence material including a dopant containing Ir $(ppy)_3$(fac tris(2-phenylpyridine)iridium) or a fluorescence material containing Alq3(tris(8-hydroxyquinolino)aluminum). Other materials may be used.

When the light emitting layer 143 emits blue light, the light emitting layer 143 includes a host material containing CBP or mCP. Further, the light emitting layer 143 may be formed of a phosphorescence material including a dopant containing $(4,6-F_2\ ppy)_2$Irpic or a fluorescence material containing any one selected from the group consisting of spiro-DPVBi, spiro-6P, distyryl-benzene (DSB), distyryl-arylene (DSA), PFO-based polymer, PPV-based polymer and a combination thereof. Other materials may be used.

The electron transport layer 144 may smoothly perform the transport of electrons. The electron transport layer 144 may be formed of at least one selected from the group consisting of Alq3(tris(8-hydroxyquinolino)aluminum, PBD, TAZ, spiro-PBD, BAlq, and SAlq. Other materials may be used.

The electron transport layer 144 may be formed using the evaporation method or the spin coating method. The electron transport layer 144 may have a thickness of 1 nm to 50 nm.

The electron transport layer 144 may prevent holes, which are injected from the first electrode 130 and then pass through the light emitting layer 143, from moving to the second electrode 150. In other words, the electron transport layer 144 serves as a hole stop layer, thereby allowing holes and electrons to be efficiently combined with one another in the light emitting layer 143.

The electron injection layer 145 may smoothly perform the injection of electrons. The electron injection layer 145 may be formed of Alq3(tris(8-hydroxyquinolino)aluminum), PBD, TAZ, spiro-PBD, BAlq, SAlq, or LiF. Other materials may be used.

The electron injection layer 145 may further contain an inorganic material. The inorganic material may further include a metal compound. The metal compound may include alkali metal or alkaline earth metal. The metal compound including the alkali metal or the alkaline earth metal may be at least one selected from the group consisting of LiQ, LiF, NaF, KF, RbF, CsF, FrF, BeF$_2$, MgF$_2$, CaF$_2$, SrF$_2$, BaF$_2$, and RaF$_2$. Other materials may be used.

The electron injection layer 145 may be formed using the evaporation method or the spin coating method. Alternatively, the electron injection layer 145 may be formed by performing a co-deposition method on an organic material and an inorganic material. The electron injection layer 145 may have a thickness of 1 nm to 50 nm.

The second electrode 150 may be a cathode electrode and may be formed of magnesium (Mg), calcium (Ca), aluminum (Al), and silver (Ag) having a low work function or an alloy thereof. When the OLED display 100 has a top emission or dual emission structure, the second electrode 150 may be thin enough to transmit light. When the OLED display 100 has a bottom emission structure, the second electrode 150 may be thick enough to reflect light.

The organic buffer layer 160 on the entire surface of the organic light emitting diode 120 may prevent the penetration of moisture and oxygen from the outside and protect the organic light emitting diode 120 from an external impact.

The organic buffer layer 160 may be formed of a material having the hydroxy group or the amide group and may be formed of a compound represented by the following chemical formula 1.

[Chemical Formula 1]

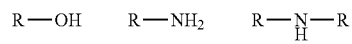

where R is an aromatic compound or an aliphatic compound including carbon (C), nitrogen (N), oxygen (O), and sulfur (S).

The compound represented by the above chemical formula 1 may be one selected among the following compounds.

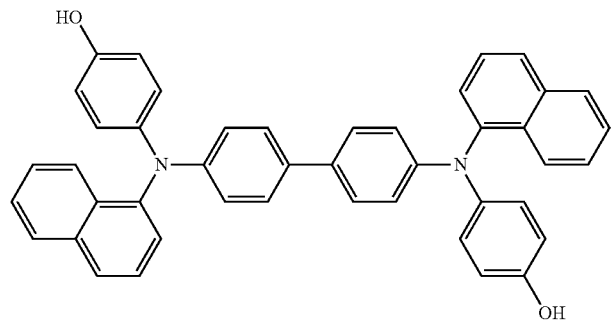

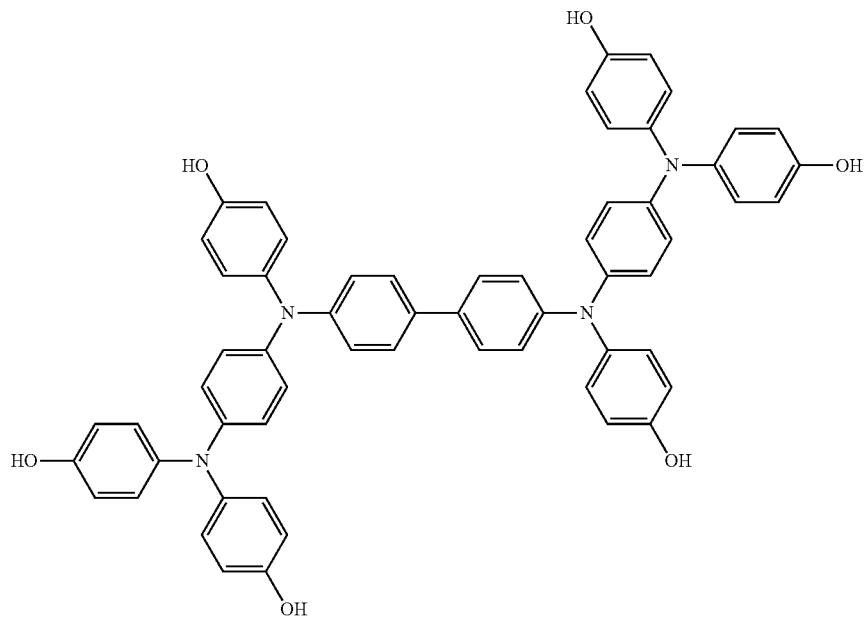

-continued

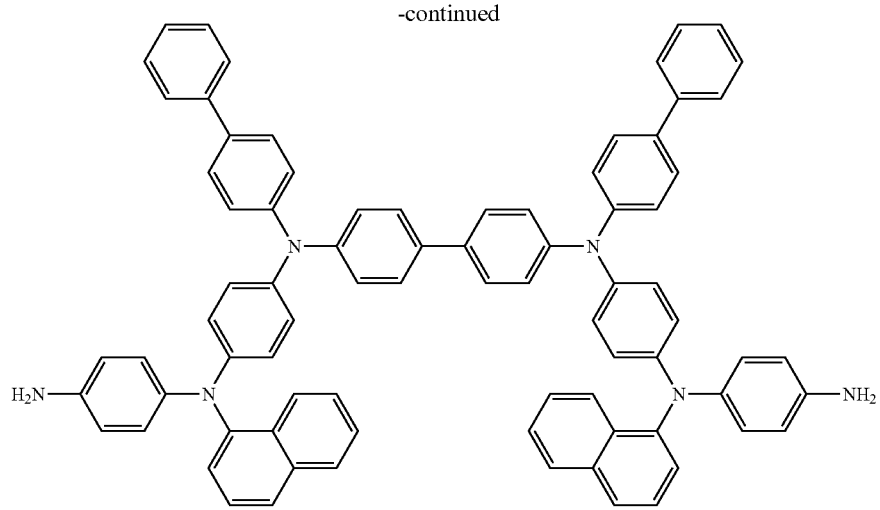

The compound may have molecular weight of 200 Mw to 5,000 Mw. When the molecular weight of the compound constituting the organic buffer layer 160 is equal to or greater than 200 Mw, a pollution of a chamber resulting from the very active dispersion of the compound may be prevented in a subsequent deposition process of the organic buffer layer 160, and a deposition rate may be easily adjusted. When the molecular weight of the compound constituting the organic buffer layer 160 is equal to or less than 5,000 Mw, the compound may be prevented from burning because of a very high evaporation temperature in the deposition process of the compound The sealant 170 is positioned on the entire surface of the organic buffer layer 160. The sealant 170 may be an adhesive used to attach the first substrate 110, on which the organic light emitting diode 120 is formed, to the second substrate 180. Preferably, the sealant 170 may be epoxy-based material.

In the exemplary embodiment of the invention, because the sealant 170 surrounds the entire surface of the organic buffer layer 160, adhesive characteristic at an interface between the sealant 170 and the organic buffer layer 160 has to be excellent. For this, the sealant 170 may be formed of the epoxy-based material capable of coupling with the hydroxy group or the amide group of the organic buffer layer 160.

The epoxy-based material of the sealant 170 may be attached to the second substrate 180 and then may couple with the hydroxy group or the amide group positioned at an end of the organic buffer layer 160 through a curing process.

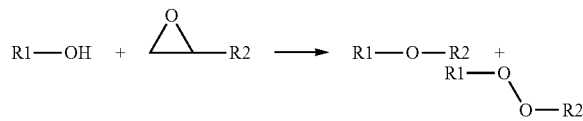

Accordingly, the adhesive characteristic at the interface between the sealant 170 and the organic buffer layer 160 may be excellent.

The second substrate 180 may use a transparent substrate formed of glass, plastic, or a conductive material. The second substrate 180 may be formed of the same material as the first substrate 110.

As above, because the OLED display 100 according to the exemplary embodiment of the invention includes the organic buffer layer 160 having the hydroxy group or the amide group capable of chemically coupling with the sealant 170, the adhesive characteristic at the interface between the sealant 170 and the organic buffer layer 160 may be improved. Accordingly, the moisture and oxygen from the outside may be prevented from penetrating into the organic light emitting diode 120. Further, because a space between the second substrate 180 and the organic light emitting diode 120 is filled, the organic light emitting diode 120 may be protected from the external impact.

A method of manufacturing the OLED display according to the exemplary embodiment of the invention is described below with reference to FIGS. 3A to 3C.

Figure 3A:
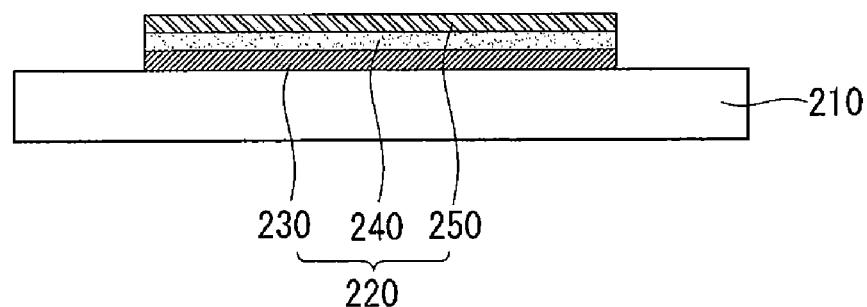
FIGS. 3A to 3C sequentially illustrate a method of manufacturing an organic light emitting diode display according to an exemplary embodiment of the invention.
Figure 3B:
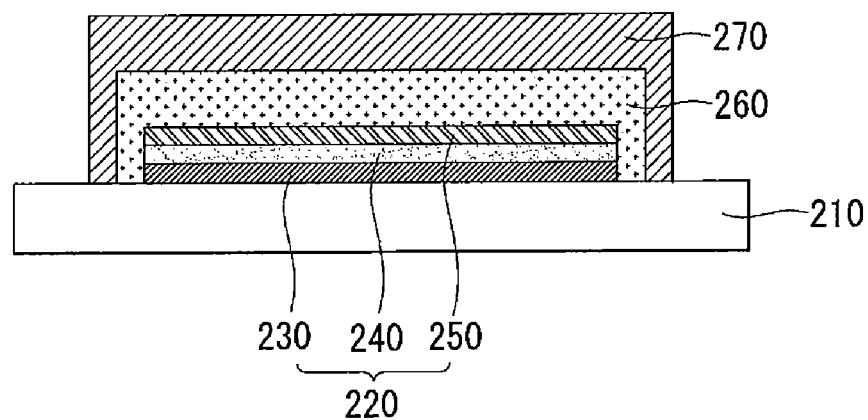
Figure 3C:
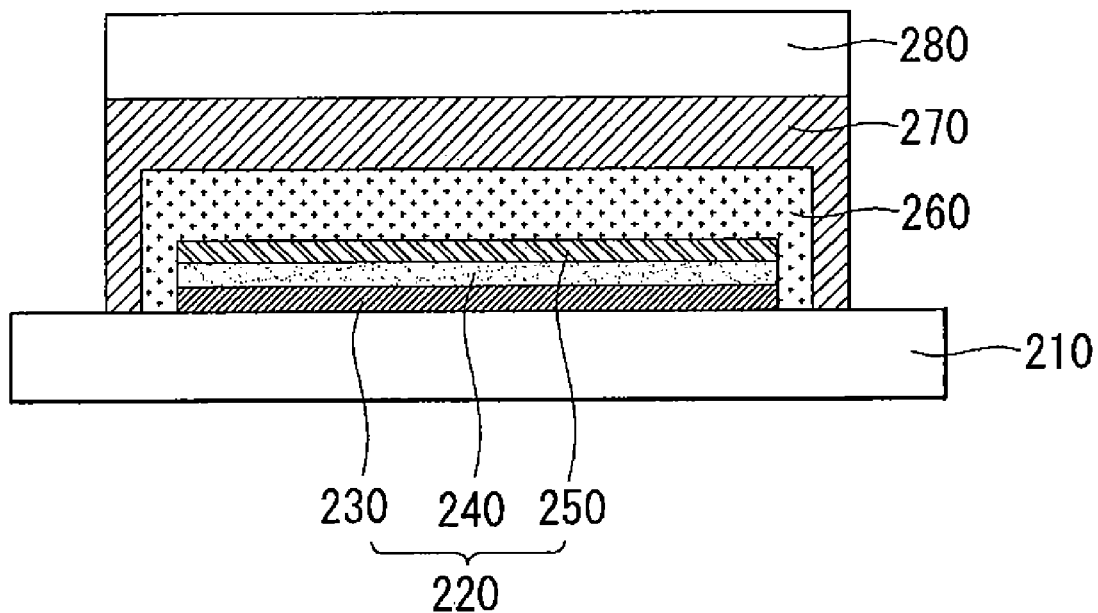

FIGS. 3A to 3C are cross-sectional views sequentially illustrating a method of manufacturing an OLED display according to an exemplary embodiment of the invention.

As shown in FIG. 3A, one of indium-tin-oxide (ITO), indium-zinc-oxide (IZO), and zinc oxide (ZnO) is deposited on a transparent first substrate 210 formed of glass, plastic, or the conductive material to form a first electrode 230.

Subsequently, the above-described material for forming each of a hole injection layer and a hole transport layer is deposited on the first electrode 230 to form the hole injection layer and the hole transport layer. A material emitting red, green, or blue light is deposited on the hole transport layer to form a light emitting layer. An electron transport layer and an electron injection layer are formed on the light emitting layer. As a result, an organic layer 240 is completed.

Subsequently, magnesium (Mg), calcium (Ca), aluminum (Al), silver (Ag), or an alloy thereof is deposited on the first substrate 210 including the organic layer 240 to form a second electrode 250. Hence, an organic light emitting diode 220 is formed.

Next, as shown in FIG. 3B, an organic buffer layer 260 is formed on the entire surface of the organic light emitting diode 220 formed thus. In other words, a compound having the hydroxy group or the amide group is formed on the first substrate 210 on which the organic light emitting diode 220 is formed.

The organic buffer layer 260 may be formed using an evaporation method and may have a thickness of 10 μm to 500 μm.

Subsequently, a sealant 270 is formed on the first substrate 210 on which the organic buffer layer 260 is formed. The sealant 270 may be formed of the epoxy-based material in a paste or film form.

Next, as shown in FIG. 3C, a second substrate 280 is aligned and then attached on the sealant 270. A process for curing the sealant 270 is then performed. The curing process may include an UV curing process or a thermal curing process. In the thermal curing process, the process conditions may vary based on the epoxy-based material for forming the sealant 270. In this case, when the epoxy-based material is cured, the epoxy-based material may chemically couple with the hydroxy group or the amide group positioned at an end of the organic buffer layer 260.

Accordingly, adhesive characteristic at an interface between the sealant 270 and the organic buffer layer 260 may be improved because of the chemical coupling between the epoxy-based material and the organic buffer layer 260. As a result, an OLED display 200 according to the exemplary embodiment of the invention may be manufactured.

As above, because the OLED display 200 according to the exemplary embodiment of the invention includes the organic buffer layer 260 having the hydroxy group or the amide group capable of chemically coupling with the sealant 270, the adhesive characteristic at the interface between the sealant 270 and the organic buffer layer 260 may be improved. Accordingly, the moisture and oxygen from the outside may be prevented from penetrating into the organic light emitting diode 220. Further, because a space between the second substrate 280 and the organic light emitting diode 220 is filled, the organic light emitting diode 220 may be protected from the external impact.

The exemplary embodiments of the invention described a passive matrix type OLED display as an example, but are not limited thereto. For example, the exemplary embodiment of the invention may be applied to an active passive matrix type OLED display in which a first substrate includes thin film transistors.

Hereinafter, various examples are described to help understanding of the exemplary embodiments of the invention. However, it should be noted that the following examples are merely illustrative of the exemplary embodiments of the invention, and the exemplary embodiments of the invention are not limited thereto.

COMPARATIVE EXAMPLE 1

Indium-tin-oxide (ITO) was deposited on a glass substrate to form a first electrode having a thickness of 130 nm. A blue light emitting layer having a thickness of 25 nm was formed on the first electrode by mixing 2 wt % of perylene as a dopant into DPVBi (4,4'-bis(2,2'-diphenyl vinyl)-1,1'-biphenyl) as a host. Aluminum (Al) was deposited on the blue light emitting layer to form a second electrode having a thickness of 150 nm. Hence, an organic light emitting diode was manufactured.

Next, Alq3 was deposited on the entire surface of the organic light emitting diode to form an organic buffer layer. An epoxy resin was deposited on the organic buffer layer to form a sealant. Then, a second substrate was attached to the glass substrate using the sealant. Hence, an OLED display was manufactured.

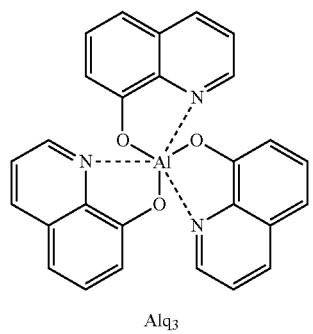

Alq3

COMPARATIVE EXAMPLE 2

An OLED display according to a comparative example 2 was manufactured under the same process conditions as the above comparative example 1, except that DNTPD was deposited to form an organic buffer layer.

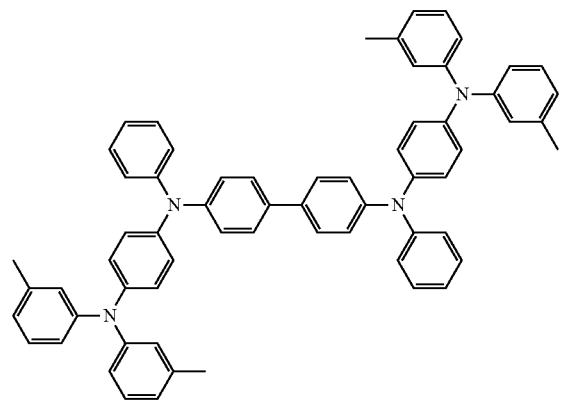

DNTPD

EXPERIMENTAL EXAMPLE 1

An OLED display according to an experimental example 1 was manufactured under the same process conditions as the above comparative example 1, except that a compound having a hydroxy group represented by the following chemical formula was deposited to form an organic buffer layer.

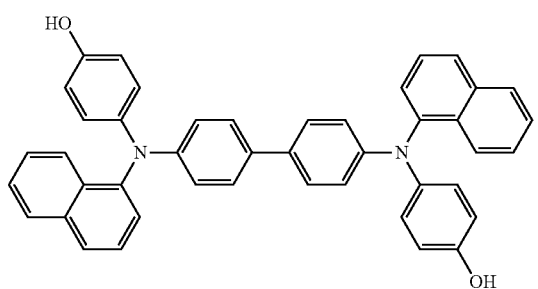 [SMILES: Oc1ccc(N(c2ccc(-c3ccc(N(c4ccc(O)cc4)c4cccc5ccccc45)cc3)cc2)c2cccc3ccccc23)cc1]

EXPERIMENTAL EXAMPLE 2

An OLED display according to an experimental example 2 was manufactured under the same process conditions as the above comparative example 1, except that a compound having a hydroxy group represented by the following chemical formula was deposited to form an organic buffer layer.

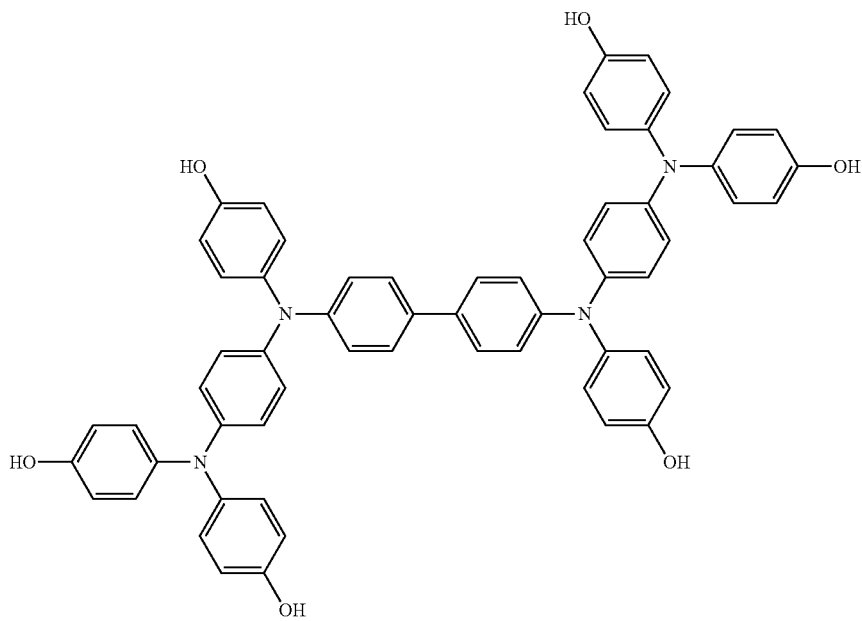 [SMILES: Oc1ccc(N(c2ccc(O)cc2)c2ccc(N(c3ccc(O)cc3)c3ccc(-c4ccc(N(c5ccc(O)cc5)c5ccc(N(c6ccc(O)cc6)c6ccc(O)cc6)cc5)cc4)cc3)cc2)cc1]

EXPERIMENTAL EXAMPLE 3

An OLED display according to an experimental example 3 was manufactured under the same process conditions as the above comparative example 1, except that a compound having an amide group represented by the following chemical formula was deposited to form an organic buffer layer.

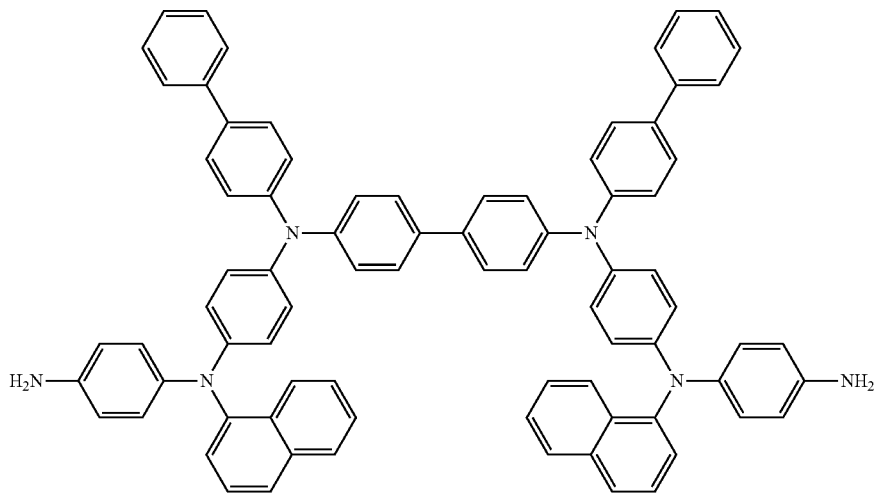 [SMILES: Nc1ccc(N(c2ccc(N(c3ccc(-c4ccccc4)cc3)c3ccc(-c4ccc(N(c5ccc(-c6ccccc6)cc5)c5ccc(N(c6ccc(N)cc6)c6cccc7ccccc67)cc5)cc4)cc3)cc2)c2cccc3ccccc23)cc1]

Initial penetration time of moisture penetrated into each of the OLED displays manufactured according to the comparative examples 1 and 2 and the experimental examples 1 to 3 was measured in the atmosphere of a temperature of 85° C. and humidity of 85%. The initial moisture penetration time was indicated in the following Table 1.

TABLE 1

| | Thickness of organic buffer layer (Å) | Initial moisture penetration time (hour) |
|---|---|---|
| Comparative example 1 | 1000 | 22 |
| Comparative example 2 | 1000 | 23 |
| Experimental example 1 | 1000 | 29 |
| Experimental example 2 | 1200 | 32 |
| Experimental example 3 | 1000 | 28 |

As indicated in the above Table 1, the initial moisture penetration time in the experimental examples 1 to 3 including the organic buffer layer having the hydroxy group or the amide group was much later than the initial moisture penetration time in the comparative examples 1 and 2 including the organic buffer layer not having the hydroxy group or the amide group.

In other words, because the hydroxy group or the amide group of the organic buffer layer was chemically coupled with the sealant in the experimental examples 1 to 3, adhesive characteristics at an interface between the organic buffer layer and the sealant may be improved. Further, the penetration of moisture from the outside may be prevented.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A method of manufacturing an organic light emitting diode display comprising:
    forming an organic light emitting diode including a first electrode, an organic layer having at least a light emitting layer, and a second electrode on a first substrate;
    forming an organic buffer layer having a hydroxy group or an amide group on an entire surface of the organic light emitting diode;
    forming a sealant on an entire surface of the organic buffer layer; and
    attaching a second substrate opposite the first substrate to the first substrate,
    wherein the organic buffer layer is one selected from a group consisting of the following compounds

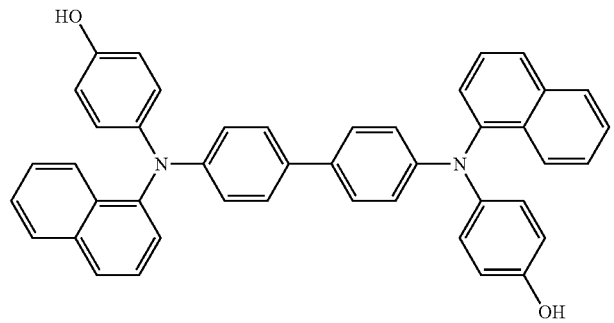

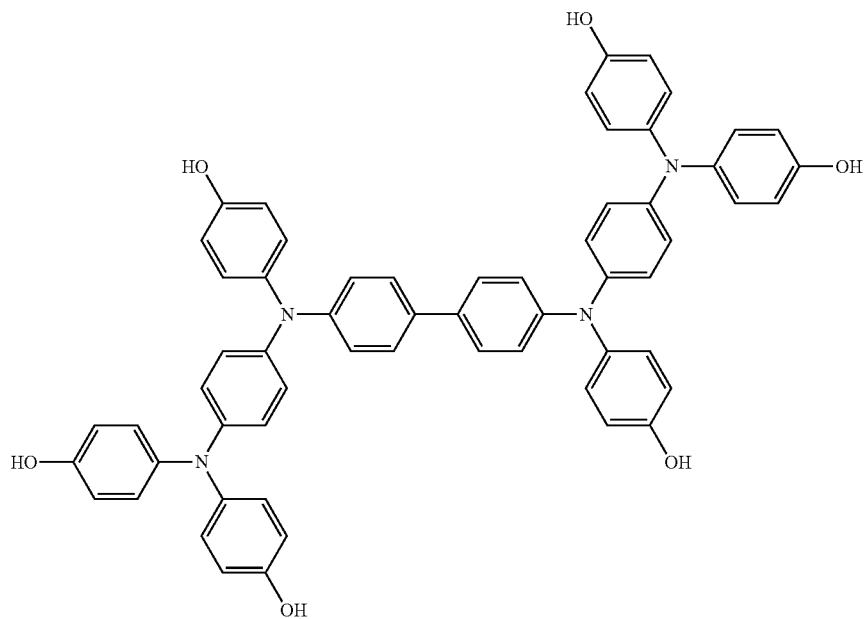

-continued
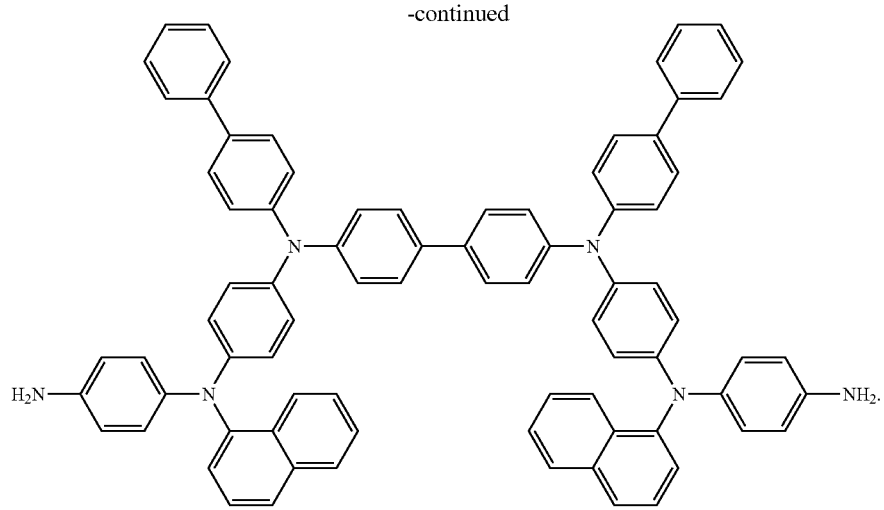
2. The method of claim 1, further comprising, after forming the sealant, curing the sealant.
* * * * *